United States Patent
Smith (10) Patent No.: US 7,913,213 B2
(45) Date of Patent: Mar. 22, 2011

(54) TOOL AND METHOD FOR AUTOMATICALLY IDENTIFYING MINIMUM TIMING VIOLATION CORRECTIONS IN AN INTEGRATED CIRCUIT DESIGN

(75) Inventor: Richard W. Smith, Fort Collins, CO (US)

(73) Assignee: Oracle America, Inc., Redwood City, CA (US)

( * ) Notice: Subject to any disclaimer, the term of this patent is extended or adjusted under 35 U.S.C. 154(b) by 383 days.

(21) Appl. No.: 12/100,505

(22) Filed: Apr. 10, 2008

(65) Prior Publication Data

US 2009/0259979 A1   Oct. 15, 2009

(51) Int. Cl.
*G06F 9/455* (2006.01)

(52) U.S. Cl. ........ 716/113; 716/100; 716/101; 716/102; 716/103; 716/106; 716/108; 716/111; 716/114

(58) Field of Classification Search .................. 716/1–3, 716/5–6, 18
See application file for complete search history.

(56) References Cited

U.S. PATENT DOCUMENTS

| | | | |
|---|---|---|---|
| 6,009,248 A | 12/1999 | Sato et al. | |
| 6,230,302 B1 | 5/2001 | Gabele et al. | |
| 6,922,818 B2 * | 7/2005 | Chu et al. | 716/2 |
| 6,988,254 B2 * | 1/2006 | Iwanishi et al. | 716/6 |
| 7,114,136 B2 | 9/2006 | Chase et al. | |
| 7,278,126 B2 * | 10/2007 | Sun et al. | 716/6 |
| 7,694,242 B1 * | 4/2010 | Li et al. | 716/1 |
| 2008/0216036 A1 | 9/2008 | Foreman et al. | |

\* cited by examiner

*Primary Examiner* — Nghia M Doan
(74) *Attorney, Agent, or Firm* — Meyertons, Hood, Kivlin, Kowert & Goetzel, P.C.; Stephen J Curran (57) ABSTRACT

A design tool for automatically identifying minimum timing violation corrections in an integrated circuit (IC) design includes program instructions executable by a processor to identify locations to add a delay along each circuit path having a minimum timing violation. The tool may also sequentially try each of a plurality of circuit changes that add the delay and to evaluate a result of each circuit change until an acceptable percentage of the minimum timing violation has been corrected. In response to each circuit change, the design tool may update an internal node report, which includes a listing of circuit nodes and a maximum timing slack available at each node, by reducing a maximum slack value of each affected node by an amount of the added delay. The design tool may generate an output report that includes a listing of the circuit changes which correct the minimum timing violations.

17 Claims, 4 Drawing Sheets

TOOL AND METHOD FOR AUTOMATICALLY IDENTIFYING MINIMUM TIMING VIOLATION CORRECTIONS IN AN INTEGRATED CIRCUIT DESIGN

BACKGROUND OF THE INVENTION

1. Field of the Invention

This invention relates to electronic design automation tools and, more particularly, to minimum timing violations and path delay analysis.

2. Description of the Related Art

During the design of an integrated circuit (IC), an automated design tool may be used to create the IC. The design flow includes a number of steps including schematic capture, circuit simulation, netlist creation, circuit layout, and others. In addition, to identify potential timing problems in the circuit, timing analysis is performed on the netlist. More particularly, the time that it takes signals such as clocks and data to propagate along a given path from a source to a destination is referred to as the path delay. There are a variety of ways of performing timing analysis. For example, static timing analysis and statistical timing analysis are both commonly used.

The result of the timing analysis may be a path report that lists all paths that violate the minimum timing rules for the design. The path report may list the paths and their respective delays. These paths may be referred to as minimum timing violation (mintime violation) paths. Generally, a mintime violation results when either the datapath is too fast or the clock or timing path is too slow such the data is changing or is gone before the data can be captured. In conventional design tools, to fix the minimum timing violations, the designer may iteratively make manual fixes (or changes to the netlist) by adding delays, and each time rerunning the timing analysis tool to verify the fixes, which may take many hours to run, and which may introduce maximum timing violations.

SUMMARY

Various embodiments of a design tool, method and system for automatically identifying minimum timing violation corrections in an integrated circuit (IC) design are disclosed. In one embodiment, an automated integrated circuit design tool includes program instructions storable on a computer readable medium. The program instructions may be executable by a processor to create an internal node report that corresponds to a received node report for the IC. The node report may include a listing of circuit nodes and a maximum timing slack available at each of the nodes. For each circuit path having a minimum timing violation, the design tool may identify a location along the circuit path to add a delay. The tool may also sequentially try each of a plurality of circuit changes that add the delay and evaluate a result of each circuit change until an acceptable percentage of the minimum timing violation has been corrected. In response to each circuit change, the design tool may update the internal node report by reducing a maximum slack value of each affected node by an amount of the added delay. The design tool may generate an output report that includes a listing of the circuit changes which correct the minimum timing violations.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

As described above, there are many steps in the IC design flow. Accordingly, the design flow may use a number of design tools that may be task dependent. The design tools generally include software tools that run on a workstation or other type of computer system having processing capability (shown in FIG. 3). In some embodiments, depending on the design tool, some tasks may be performed by one tool, and other tasks may be performed by other tools. In other embodiments, one design tool may include a suite of design tools to handle the various steps in the design flow. The following description is meant to encompass all types of design tool implementations whether they may be stand-alone tools or part of suite of design tools.

Figure 1A:
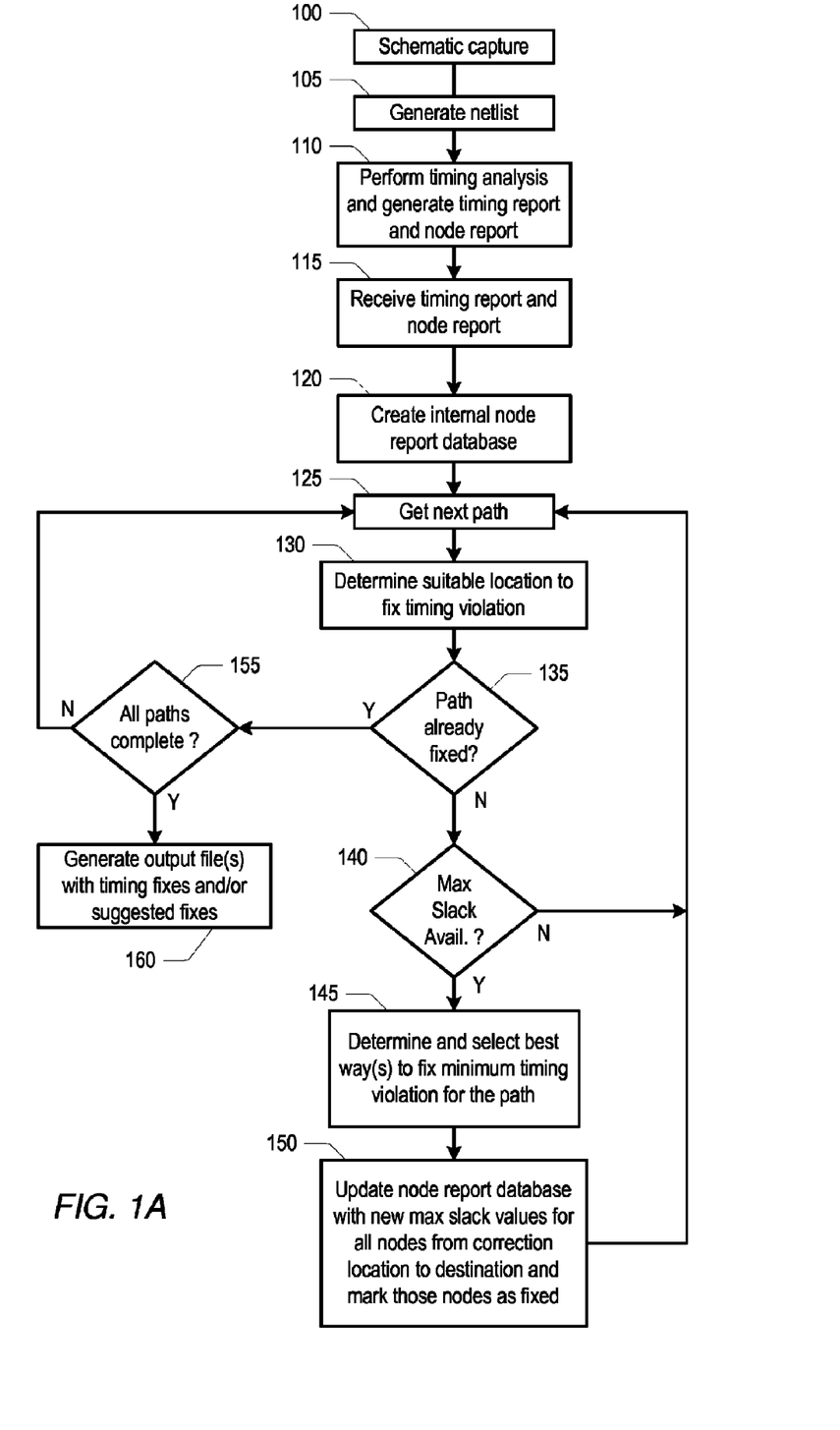
FIG. 1A is a flow diagram describing the operation of an embodiment of an IC design tool for correcting minimum timing violations.

Turning now to FIG. 1A, a flow diagram describing the operation of an embodiment of an IC design tool for identifying corrections for circuit paths having minimum timing violations is shown. Beginning in block 100, a schematic representation of the integrated circuit is created or synthesized from a hardware description language representation such as RTL, for example. This is sometimes referred to as schematic capture. In addition, the RTL circuit representation may be synthesized into a netlist (e.g., FIG. 3; #15) by a synthesis tool (block 105). The netlist includes a listing of the circuit components and their connectivity. The netlist may also include or refer to descriptions of the circuit components. The netlist may be input to a timing analyzer design tool (e.g., FIG. 3; #11).

The timing analyzer may analyze all clock and data paths in the IC design to ensure that that design meets timing. Depending on the type of analysis, the timing analyzer may take into account all the resistor-capacitor (RC) time constants of the wires, the wire thicknesses, the distances between components, the intrinsic delays of each component, and the like. The timing analyzer may generate a timing report (e.g., FIG. 3; #13) that includes a listing of all circuit paths that have minimum timing violations and their associated path delays (block 110). The timing report may list the paths with the worst minimum timing violations first. In addition, the timing analyzer may generate a node report (e.g., FIG. 3; #19) that may list the nodes in the IC design and the maximum slack available at each node. Slack typically refers to the difference between the required time and arrival time of the signal propagating on that path, or the amount of "spare" time. Generally, a path having positive slack means the timing target has been exceeded and a negative slack means the target has been missed. Thus, for a maximum timing path, negative slack generally refers to the data on a path being too slow, and for minimum timing paths, negative slack refers to the data being too fast. So for minimum timing violations the data may arrive and be gone before the destination flip-flop (FF) can capture it. In this case, either the data is too fast, or the clock is too slow. Thus, Max Slack refers to the amount of time at a node that is in excess of what is necessary to meet timing.

A minimum timing violation (MTV) tool portion of the design tool may be a user configurable design tool that may receive the timing and node reports, identify fixes to be made in the IC design, and then output one or more files which may be used by the design tools to implement the fixes either automatically, or in some cases manually with designer intervention. The MTV tool may fix a vast majority of minimum timing violations in the design without creating maximum timing violations, and do so in a single pass, thereby saving valuable time in the design cycle. More particularly, once the timing analyzer generates the timing reports for the MTV tool, the MTV tool may fix the timing violations without further invocation of the timing analyzer. Instead, as described further below, the MTV tool may calculate delay deltas between library cell delays of prospective changes to the netlist during an MTV tool run. In addition as described further below, the MTV tool uses an internal scoring mechanism, which may allow the MTV tool to evaluate the effectiveness of the potential design changes and to choose one type of fix over another type of fix. This may be particularly useful when trying to optimize for area or power when choosing the best fix.

The MTV tool may receive the timing report and the node report outputs of the timing analyzer as well as have access to the device library (e.g., FIG. 3; #17) used by the timing analyzer during analysis (block 115). The MTV tool may create an internal (and interim) node report database (e.g., FIG. 3; #21) which keeps track of which paths and nodes are fixed, and the slack change at a given node after a fix has been implemented (block 120). It is noted that in one embodiment, the fixes are virtually implemented. That is to say the fixes are implemented in memory or software and the actual circuit design is not affected by the MTV tool. The MTV tool may systematically evaluate each path (block 125), beginning with the first and worst path, to identify the best possible fix (if one is available) for the path minimum timing violation.

The MTV tool may evaluate the path and determine the best location for adding delay (block 130). For example, the MTV tool may start at the data minpath source and work from left to right toward the destination. If multiple places are found that are deemed to be equivalent in terms of availability of max-slack, the choice may be biased toward the source. This enables the flow to fix multiple mintime paths that may fanout from the same node with fewer netlist changes. Using the slack values in the node report, the MTV tool may locate the node with the best downstream slack. The MTV tool may determine if that path has already been fixed by looking, for example, in the internal node report database (block 135). If the path has not been fixed, the MTV tool may use the internal node report database to determine if there is slack available at the selected location (block 140).

If there is slack available, the MTV tool determines and selects the best way to fix the minimum timing violation for the path (block 145). For example, as described in greater detail below in conjunction with the descriptions of FIG. 1B and FIG. 2A-2C, the MTV tool may systematically attempt one or more types of fixes from a list of fixes. Each attempt may be given a score based on some predetermined criteria such as area, power, percentage of violation fixed, and the like. The way that yields the best score may be selected as a fix for that path. However, the selected fix may not completely fix the timing violation. In such instances, the MTV tool may continue attempting to fix the path by adding a next type of fix and again evaluating the path. This process may continue until all possible types of fixes are tried, and the best possible timing is obtained. This means that a given path may include a combination of fixes to obtain the best possible timing under the given circuit constraints. In one embodiment, the types of fixes may include swapping the datapath source FF with a FF having more clk-to-q delay, swapping a gate in the path with a gate that has more delay, inserting a buffer, reducing the delay on any destination clock-delayed flip-flops (CDFs), or reducing the delay in an L0header in the clock path of the datapath destination FF, etc.

After each fix(es) has been implemented, the MTV tool may update the internal node report with the updated slack values at each affected node, and that node and all downstream nodes are marked as fixed (block 150). In one embodiment, the slack values of the nodes in the internal node report may be updated after each fix is tried, so that any additional fixes for that path may be evaluated accurately. In one embodiment, updating the slack values may include reducing the amount of available slack at each node to the right of the fix by the amount of the delay introduced by the fix. Once the MTV tool determines that the best possible timing has been obtained, the MTV tool evaluates the next path in the timing report as described above in conjunction with the description of block 125.

Referring back to block 135, as described above, the MTV tool analyzes each path in the timing report. However, since each node and all downstream nodes are identified as fixed when a fix is implemented, it is possible that a path listed later in the report may be fixed as a result of a path listed above being fixed. Accordingly, if the path has already been fixed, the MTV tool may then check to see if all paths have been evaluated (block 150). If all paths have not been evaluated, the MTV tool gets the next path as described above in conjunction with the description of block 125. However if all paths have been evaluated, the MTV tool may output one or more files that may include a listing of the suggested fixes for each path. Additionally, depending upon how the MTV tool is configured by the user, the MTV tool may output the files in a variety of formats that may be readable by a human or by the synthesis tool or other design tools to automatically implement the fixes listed in the output file. In one embodiment, the design tool may read the MTV tool output file and automatically make changes to the netlist. In other embodiments, the output file may include recommendations that a designer may evaluate before making changes. For example, some circuit changes (e.g., CDF downgrades and L0header reductions) may introduce maximum timing violations that may not be possible to evaluate with the MTV tool. Thus in some embodiments, the MTV tool may be configured such that these types of fixes may not be output in formats that can automatically be implemented by the other design tools.

Figure 1B:
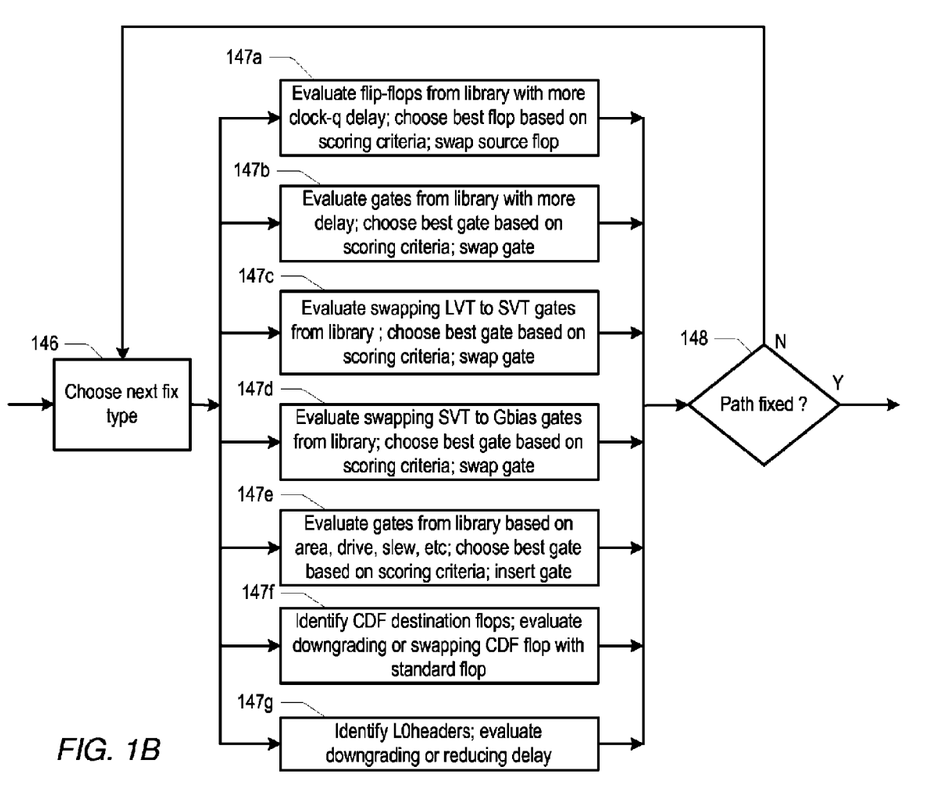
FIG. 1B is a flow diagram describing more detailed aspects of the operation of the IC design tool for correcting minimum timing violations of FIG. 1.
Figure 2A:
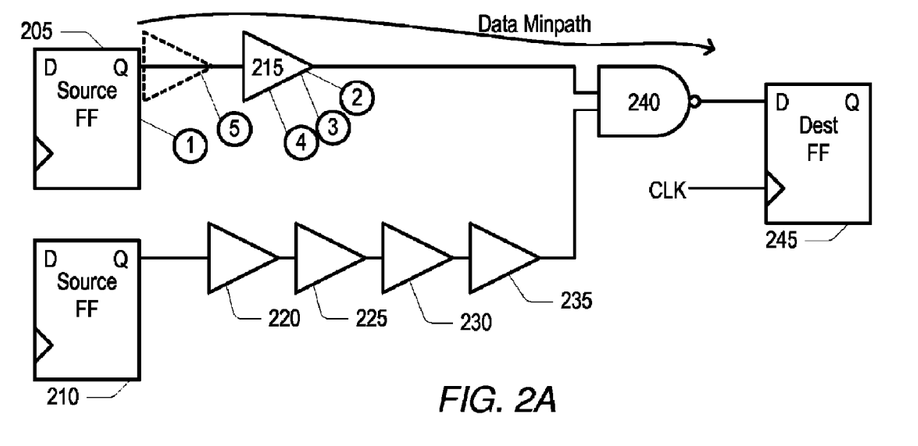
FIG. 2A is a block diagram depicting an exemplary data timing path including a minimum timing violation.
Figure 2B:
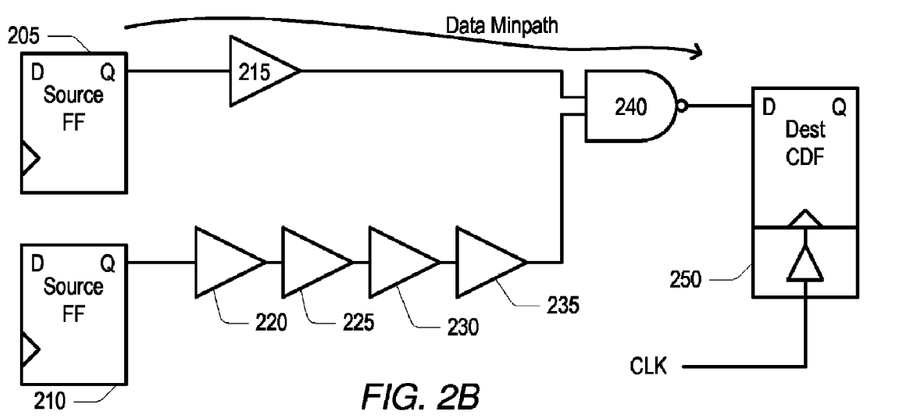
FIG. 2B is a block diagram depicting another exemplary data timing path including a minimum timing violation.

As described above, the MTV tool may attempt to fix a path having a minimum timing violation using one or more types of "fixes" or "circuit changes." The MTV tool flow may include sequentially attempting the different types of fixes in a particular order. Each attempted fix may be scored and evaluated, and the best scoring fix may be used. A flow diagram describing more detailed aspects of the operation of the IC design tool for correcting minimum timing violations of FIG. 1 is shown in FIG. 1B. In FIG. 2A through FIG. 2B, the various types of fixes are illustrated in exemplary block diagrams.

Turning to FIG. 2A, the exemplary circuit includes a data mintiming path that includes source FF 205 coupled to a buffer 215, which is coupled to one input of a two-input NAND gate 240, the output of which is coupled to the 'D' input of destination FF 245. The other datapath includes source FF 210 coupled to a chain of buffers (e.g., 220, 225, 230, 235) which is coupled to the other input of NAND gate 240 and to the 'D' input of destination FF 245. The circles with numbers correspond to the order in which the MTV tool may attempt a particular type of fix, and will be described further below.

The circuit shown in FIG. 2B is similar to the circuit shown in FIG. 2A, except the destination FF 245 of FIG. 2A has been replaced with a clock-delayed flop (CDF) 250. As shown, the CDF 250 includes a delay element in the CLK input, which serves to delay the clk signal.

Figure 2C:
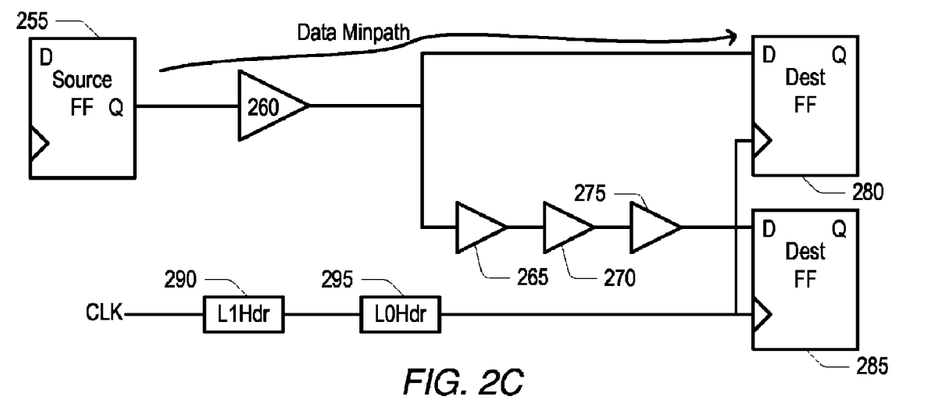
FIG. 2C is a block diagram depicting yet another exemplary data timing path including a minimum timing violation.

The exemplary circuit shown in FIG. 2C includes a data minpath that includes a source FF 255 coupled to a buffer 260, which is coupled to the 'D' input of destination FF 280. The output of buffer 260 is also coupled to a chain of buffers (e.g., 265, 270, and 275), which is coupled to 'D' input of destination FF 285. The CLK signal is coupled to an L1header 290, which is coupled to an L0header 295, which is in turn coupled to the CLK inputs of both destination FFs 280 and 285.

Referring collectively to FIG. 1B, and FIG. 2A-2C, and beginning in block 146 of FIG. 1B, in the illustrated embodiment, the MTV tool may be configured to choose the next fix type. As shown, the MTV tool may sequentially attempt each of the fix types shown in blocks 147a-147g if each previous fix type does not fix the minimum timing violation 100%. In other words, once an attempted fix type removes 100% of the violation, then the MTV tool may get the next path with a violation.

Accordingly, if a location was deemed suitable in the flow described in FIG. 1A, then the MTV tool may attempt to first swap the source FF 215 with a FF having a greater CLK-to-q delay (block 147a). This corresponds to the circle with reference number 1 in FIG. 2A. The MTV tool may access the device library in search of a suitable FF to swap. Swapping an existing component with a footprint-compatible component may be preferable over swapping with a larger footprint component, or over inserting an additional component since no additional die area is used, and no or less additional power is consumed. If the MTV tool finds a suitable FF to swap, the MTV tool makes the change and evaluates the result. For example, the MTV tool scores the impact of the circuit change using a number of score elements or predetermined criteria. In addition, a respective weight may be given to each scoring element depending on that element's importance in a given design. Thus, percentage of violation fixed may be more important than slew rate in a given design and thus may have a higher weight assigned to it. For example, in one embodiment, scoring elements may include: the percentage of the violation fixed, the maxtime margin available after the swap, are any slow nodes created, the change in area, the change in slew rate, or the change in power, among others. There may be several choices of FFs in the library. Each FF may be tried and scored and the best scoring FF may be selected. Once the swap is implemented, if 100% of the violation is fixed (block 148), the MTV tool may update the internal node report as described above and get the next path as described in the flow shown in FIG. 1A.

However, if the minimum timing violation is not 100% fixed, the MTV tool may update the internal node report, and select another fix type (block 146). In the illustrated embodiment, the next fix type corresponds to attempting to find a gate in the device library to swap with an existing gate in the data minpath. For example, as shown in FIG. 2A, reference number 2 indicates buffer 215 may be swapped with another buffer having a larger delay. The device library may include a number of suitable gates, each having different delays, drive strengths, area, etc. Thus, similar to the swapping of the source FF, the MTV tool may evaluate and score each gate swap possibility separately. The MTV tool may then select the buffer with the best score, and swap it with the existing buffer 215. Again, if 100% of the violation is fixed (block 148), the MTV tool may get the next path as described in the flow shown in FIG. 1A.

However, if the minimum timing violation is not 100% fixed, the MTV tool may select another fix type (block 146). In the illustrated embodiment, the next two fix types correspond to swapping buffer 215 from a low voltage threshold (LVT) gate, which are usually faster, to a standard voltage threshold (SVT) gate (block 147c), and if that doesn't fix the violation 100%, trying to swap from SVT to a Gbias gate (block 147d). These fixes correspond to the circles with reference numbers 3 and 4 in FIG. 2A. In each case, the MTV tool may score each possible swap independently and choose the best scoring component.

However, if the minimum timing violation is still not 100% fixed, the MTV tool may attempt to insert a buffer (block 147e). This corresponds to the circle with reference number 5 and the buffer shown in dotted lines in FIG. 2A. In one embodiment, the MTV tool may access the device library in search of a gate to insert at the selected location. Again, there may be a number of gates suitable to insert. In such a case, the MTV tool may independently evaluate each suitable gate by scoring the insertion as outlined above. The MTV tool may select and insert the best scoring gate, and update the internal node report. If the minimum timing violation is fixed, the MTV tool may get the next path. If the minimum timing violation is not 100% fixed, the MTV tool may select another fix type (block 146).

In the illustrated embodiment, the next fix type corresponds to FIG. 2B. As shown in FIG. 2B a CDF 250 is used as the destination flop. As such, the MTV tool may evaluate the results of incrementally downgrading (i.e., shortening) the delay associated with the CLK signal at the destination flop and thereby allowing the CDF 250 to capture the data sooner. After each downgrade, the MTV tool may score and evaluate the change as described above. In addition, in the event that the MTV tool has to downgrade the CDF delay to zero, the MTV tool may recommend swapping the CDF flop with a standard FF. However, the downstream effects of such a change in CDF delay may not be accurately measured. For example, the MTV tool may not be able to accurately determine if a maxtime violation may be introduced down stream from CDF 250 as a result of reducing the delay. Accordingly, in one embodiment this type of change may only be listed in the output file as a recommendation to the design engineer. If the minimum timing violation is fixed with this change, the MTV tool may get the next path.

If the minimum timing violation is not 100% fixed, the MTV tool may select another fix type (block 146). This fix type corresponds to FIG. 2C. Accordingly, as shown, the MTV tool may attempt to downgrade the delay in the L0header 295. An L0header is sometimes a convenient way for designers to implement multiple CDF destination flops without the added area or complexity. The MTV tool may incrementally downgrade (shorten) the delay of the L0header, while scoring and evaluating the effects of each change. Similar to the above flow regarding the downgrading of CDF flops, the downstream effects of such a change in L0header delay may not be accurately measured. For example, while the MTV tool may calculate the effects of the change on the timing path to destination FF 285, the MTV tool may not be able to accurately determine if a maxtime violation may be introduced downstream from either of destination FFs 280 or 285 as a result of reducing the delay. Accordingly, in one embodiment, this type of change may only be listed in the output file as a recommendation to the design engineer. If the minimum timing violation is fixed with this change, the MTV tool may get the next path. If the timing violation is not 100% fixed, the MTV tool may provide the path characteristics (including the changes that were recommended and for which fixes may be implemented) in the output file.

It is noted that the MTV tool has a number of other configurable features. For example, user defined margins may be used to define minimum and maximum slack during the decision making process for swapping and inserting gates from the library. In addition, the scoring mechanism may be configured by the flow owner. In one embodiment, the scoring mechanism may weight certain characteristics such as area power, etc. more heavily on one design than in other designs. Thus the MTV tool may be configured differently depending on the design and designer preferences.

As described above, the design tools and specifically the MTV design tool may comprise program instructions. The program instructions may be written in any programming language. The MTV design tool and the other EDA tools may comprise program instructions that execute on one or more processors of a computer system. As such, a block diagram of one embodiment of a computer system that may be used to implement the design tools is shown in FIG. 3.

Figure 3:
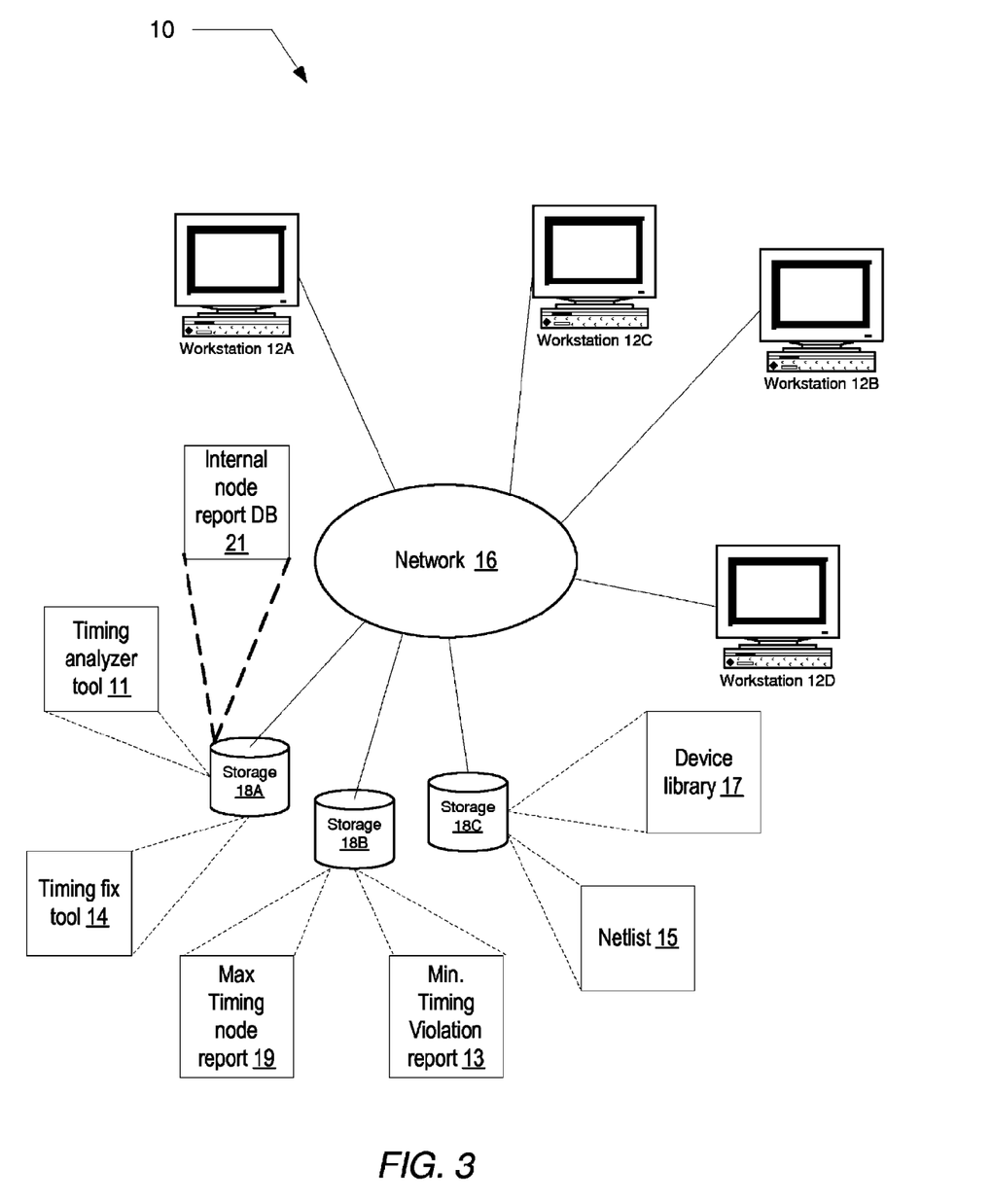
FIG. 3 is a block diagram of one embodiment of a computer system used to implement the automated IC design tool of FIG. 1A and FIG. 1B.

Turning to FIG. 3, computer system 10 includes a plurality of workstations designated 12A through 12D. The workstations are coupled together through a network 16 and to a plurality of storages designated 18A through 18C. In one embodiment, each of workstations 12A-12D may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 18A-18C may be representative of any type of mass storage device such as hard disk systems, optical media drives, tape drives, ram disk storage, and the like. As such, the program instructions comprising the design tools may be stored within any of storages 18A-18C and loaded into the local system memory of any of the workstations during execution. As an example, as shown in FIG. 3, the timing analyzer tool 11, the MTV tool 14, and the internal node report db 21 are shown stored within storage 18A, while the netlist 15 and the device library 17 are stored within storage 18C. Further, the minimum timing violation report 13 and the max timing node report 19 are stored within storage 18B. Additionally, the program instructions may be stored on a portable/removable storage media. The program instructions may be executed directly from the removable media or transferred to the local system memory or mass storages 18 for subsequent execution. As such, the portable storage media, the local system memory, and the mass storages may be referred to as computer readable storage mediums. The program instructions may be executed by the one or more processors on a given workstation or they may be executed in a distributed fashion among the workstations, as desired.

It is noted that although the computer system shown in FIG. 3 is a networked computer system, it is contemplated that in other embodiments, each workstation may also include local mass storage. In such embodiments, the program instructions and the results of the design tools may be stored locally. Further, it is contemplated that the program instructions may be executed on a standalone computer such as a personal computer that includes local mass storage and a system memory.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for automatically identifying corrections for circuit paths of an integrated circuit (IC) that include minimum timing violations, the method comprising:
   a design tool creating an internal node report corresponding to a received node report for the IC that includes a listing of circuit nodes and a maximum timing slack available at each of the nodes;
   for each circuit path having a minimum timing violation:
      the design tool identifying locations along the circuit path to change a delay;
      the design tool sequentially trying at particular locations a plurality of circuit delay changes including: selected circuit delay changes that add delay including swapping a datapath gate with a gate having a longer delay, and selected circuit delay changes that reduce a clock delay including reducing a clock delay of a destination clock-delayed flip-flop, reducing a delay of an L0header component in the clock path of a datapath destination flip-flop; and removing the L0header component in the clock path of the datapath destination flip-flop in response to the reducing the delay not correcting the minimum timing violation, and evaluating a result of each circuit change until an acceptable percentage of the minimum timing violation has been corrected;
      in response to each circuit change, the design tool updating the internal node report by reducing a maximum slack value of each affected node by an amount of the added delay; and
   the design tool generating an output report including a listing of the circuit changes which correct the minimum timing violations.

2. The method as recited in claim 1, further comprising the design tool receiving the timing report for the IC from a timing analyzer tool, wherein the timing report comprises a listing of circuit paths and corresponding path delay values, wherein circuit paths having the worst minimum timing violations are listed before other circuit paths.

3. The method as recited in claim 1, further comprising the design tool receiving the node report for the IC from a timing analyzer tool.

4. The method as recited in claim 1, further comprising the design tool generating the output report in a format executable by another design tool to automatically make netlist changes to correct the minimum timing violations.

5. The method as recited in claim 1, wherein the plurality of circuit changes comprises swapping a datapath source flip-flop with a flip-flop having a longer clock-to-q delay.

6. The method as recited in claim 1, wherein the plurality of circuit changes comprises inserting an additional gate into the circuit path.

7. The method as recited in claim 1, wherein the plurality of circuit changes comprises:
swapping the datapath destination clock-delayed flip-flop with a standard flip-flop having a shorter clock delay in response to the reducing the delay not correcting the minimum timing violation.

8. The method as recited in claim 1, further comprising the design tool assigning a score to each of the plurality of circuit changes based upon predetermined criteria and selecting one or more of the plurality of circuit changes based upon the score.

9. The method as recited in claim 8, wherein the predetermined criteria includes: a change in area resulting from the circuit change, a change in power consumption resulting from the circuit change, and a percentage of minimum timing violations corrected resulting from the circuit change.

10. An automated integrated circuit design tool for identifying minimum timing violation corrections in circuit paths of an integrated circuit (IC), the tool comprising program instructions storable on a non-transitory computer readable storage device, and executable by a processor to:
create an internal node report corresponding to a received node report for the IC that includes a listing of circuit nodes and a maximum timing slack available at each of the nodes;
for each circuit path having a minimum timing violation:
identify locations along the circuit path to change a delay;
sequentially try at particular locations a plurality of circuit delay changes including: selected circuit delay changes that add delay including swapping a datapath gate with a gate having a longer delay, and selected circuit delay changes that reduce a clock delay including reducing a clock delay of a destination clock-delayed flip-flop reducing a delay of an L0header component in the clock path of a datapath destination flip-flop; and removing the L0header component in the clock path of the datapath destination flip-flop in response to the reducing the delay not correcting the minimum timing violation, and evaluate a result of each circuit change until an acceptable percentage of the minimum timing violation has been corrected;
in response to each circuit change, update the internal node report by reducing a maximum slack value of each affected node by an amount of the added delay; and
generate an output report including a listing of the circuit changes which correct the minimum timing violations.

11. The design tool as recited in claim 10, wherein the program instructions when executed by the processor are further configured to generate the output report in a format executable by another design tool to automatically make netlist changes to correct the minimum timing violations.

12. The design tool as recited in claim 10, wherein the plurality of circuit changes comprises:
swapping a datapath source flip-flop with a flip-flop having a longer clock-to-q delay;
swapping the datapath gate with a gate having a longer delay in response to the swapping of the source flip-flop not correcting the minimum timing violation.

13. The design tool as recited in claim 10, wherein the plurality of circuit changes comprises inserting an additional gate into the circuit path.

14. The design tool as recited in claim 10, wherein the plurality of circuit changes comprises:
swapping the datapath destination clock-delayed flip-flop with a standard flip-flop having a shorter clock delay in response to the reducing the delay not correcting the minimum timing violation.

15. The design tool as recited in claim 10, wherein the program instructions when executed by the processor are further configured to assign a score to each of the plurality of circuit changes based upon predetermined criteria and to select one or more of the plurality of circuit changes based upon the score.

16. The design tool as recited in claim 15, wherein the predetermined criteria includes: a change in area resulting from the circuit change, a change in power consumption resulting from the circuit change, and a percentage of minimum timing violations corrected resulting from the circuit change.

17. A system comprising:
a memory configured to store program instructions which implement an automatic integrated circuit (IC) design tool for identifying corrections for timing paths of an IC that include minimum timing violations;
a processor coupled to the memory and configured to execute the program instructions to:
create an internal node report corresponding to a received node report for the IC that includes a listing of circuit nodes and a maximum timing slack available at each of the nodes;
for each circuit path having a minimum timing violation:
identify locations along the circuit path to change a delay;
sequentially try at particular locations a plurality of circuit delay changes including: selected circuit delay changes that add delay including swapping a datapath gate with a gate having a longer delay, and selected circuit delay changes that reduce a clock delay including reducing a clock delay of a destination clock-delayed flip-flop reducing a delay of an L0header component in the clock path of a datapath destination flip-flop; and removing the L0header component in the clock path of the datapath destination flip-flop in response to the reducing the delay not correcting the minimum timing violation;
response to each circuit change, update the internal node report by reducing a maximum slack value of each affected node by an amount of the added delay; and
generate an output report including a listing of the circuit changes which correct the minimum timing violations.

* * * * *

UNITED STATES PATENT AND TRADEMARK OFFICE
CERTIFICATE OF CORRECTION

PATENT NO. : 7,913,213 B2
APPLICATION NO. : 12/100505
DATED : March 22, 2011
INVENTOR(S) : Richard W. Smith It is certified that error appears in the above-identified patent and that said Letters Patent is hereby corrected as shown below:

In the Title:

Please change the title from "Tool And Method For Automatically Identifying Minimum Timing Violation Corrections In An Integrated Circuit Design" to "DESIGN TOOL AND METHOD FOR AUTOMATICALLY IDENTIFYING MINIMUM TIMING VIOLATION CORRECTIONS IN AN INTEGRATED CIRCUIT DESIGN".

Signed and Sealed this
Second Day of August, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,913,213 B2 | Page 1 of 1 |
| APPLICATION NO. | : 12/100505 | |
| DATED | : March 22, 2011 | |
| INVENTOR(S) | : Richard W. Smith | |

It is certified that error appears in the above-identified patent and that said Letters Patent is hereby corrected as shown below:

On the Title Page, Item (54) and at Column 1, lines 1-4, in the Title:

Please change the title from "Tool And Method For Automatically Identifying Minimum Timing Violation Corrections In An Integrated Circuit Design" to "DESIGN TOOL AND METHOD FOR AUTOMATICALLY IDENTIFYING MINIMUM TIMING VIOLATION CORRECTIONS IN AN INTEGRATED CIRCUIT DESIGN".

This certificate supersedes the Certificate of Correction issued August 2, 2011.

Signed and Sealed this
Twenty-third Day of August, 2011

David J. Kappos
*Director of the United States Patent and Trademark Office*